(12) United States Patent
Reiderman (10) Patent No.: US 11,073,634 B1
(45) Date of Patent: Jul. 27, 2021

(54) CONSTRUCTING NUCLEAR MAGNETIC RESONANCE (NMR) DEVICES BASED ON COST AND STRUCTURAL CONSTRAINTS

(71) Applicant: HALLIBURTON ENERGY SERVICES, INC., Houston, TX (US)

(72) Inventor: Arcady Reiderman, Richmond, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 616 days.

(21) Appl. No.: 16/069,429

(22) PCT Filed: Jun. 28, 2017

(86) PCT No.: PCT/US2017/039700
§ 371 (c)(1),
(2) Date: Jul. 11, 2018

(87) PCT Pub. No.: WO2019/005032
PCT Pub. Date: Jan. 3, 2019

(51) Int. Cl.
*G01V 3/32* (2006.01)
*G01R 33/44* (2006.01)
*G01R 33/383* (2006.01)

(52) U.S. Cl.
CPC ............ *G01V 3/32* (2013.01); *G01R 33/383* (2013.01); *G01R 33/44* (2013.01)

(58) Field of Classification Search
USPC ........................................ 324/303
See application file for complete search history.

(56) References Cited

U.S. PATENT DOCUMENTS

| 5,557,201 A | 9/1996 | Kleinberg et al. |
| 5,629,623 A | 5/1997 | Sezginer et al. |
| 5,705,927 A | 1/1998 | Sezginer et al. |
| 5,712,566 A * | 1/1998 | Taicher ................ G01N 24/081 324/303 |

(Continued)

FOREIGN PATENT DOCUMENTS

| CA | 2361773 C | 11/2005 |
| EP | 0581666 A2 | 2/1994 |

(Continued)

OTHER PUBLICATIONS

International Search Report and Written Opinion; PCT Application PCT/US2017/039700; dated Mar. 26, 2018.

(Continued)

*Primary Examiner* — Rodney E Fuller
(74) *Attorney, Agent, or Firm* — Polsinelli PC (57) ABSTRACT

A material for constructing a drill collar is selected based on a cost and a minimum thickness for a cross-sectional area of material that satisfies a structural constraint. An interior volume of the drill collar houses one or more downhole nuclear magnetic resonance (NMR) components based on its minimum thickness. A central magnet coupled to a booster magnetic element disposed in the interior volume. A first end magnet and a second end magnet are positioned in the interior volume proximate respective axial sides of the booster magnetic element, and an antenna assembly is positioned proximate to the interior volume, between the respective axial sides of the magnetic assembly and about at least a portion of the central magnet.

20 Claims, 9 Drawing Sheets

(56) References Cited

U.S. PATENT DOCUMENTS

| | | |
|---|---|---|
| 5,959,453 A | 9/1999 | Taicher et al. |
| 5,977,768 A | 11/1999 | Sezginer et al. |
| 6,215,304 B1 | 4/2001 | Slade |
| 6,246,236 B1 | 6/2001 | Poitzsch et al. |
| 6,268,726 B1 | 7/2001 | Prammer et al. |
| 6,291,995 B1* | 9/2001 | Speier .................. G01V 3/32 324/303 |
| 6,362,619 B2 | 3/2002 | Prammer et al. |
| 6,459,262 B1* | 10/2002 | Wisler ................ G01N 24/081 324/303 |
| 6,717,404 B2 | 4/2004 | Prammer |
| 6,836,218 B2 | 12/2004 | Frey et al. |
| 8,604,796 B2 | 12/2013 | Wisler et al. |
| 9,377,557 B2 | 6/2016 | Reiderman et al. |
| 10,197,698 B2* | 2/2019 | Reiderman ............. G01V 3/32 |
| 2002/0008514 A1* | 1/2002 | Luong ................ G01N 24/081 324/303 |
| 2003/0155915 A1 | 8/2003 | Kruspe et al. |
| 2004/0119471 A1 | 6/2004 | Blanz et al. |
| 2015/0035529 A1 | 2/2015 | Hopper et al. |
| 2015/0061664 A1 | 3/2015 | Reiderman et al. |
| 2015/0061665 A1 | 3/2015 | Reiderman et al. |
| 2017/0003413 A1 | 1/2017 | Jachmann et al. |
| 2017/0010378 A1 | 1/2017 | Reiderman et al. |
| 2020/0217192 A1* | 7/2020 | Li ..................... G01R 33/34046 |

FOREIGN PATENT DOCUMENTS

| | | |
|---|---|---|
| EP | 0940688 A2 | 9/1999 |
| EP | 1072903 A1 | 1/2001 |
| WO | 2016144460 A1 | 9/2016 |

OTHER PUBLICATIONS

Gaunkar, Neelam G., "Analysis of ringing effects due to magnetic core materials in pulsed nuclear magnetic resonance circuits," Iowa State University; Electrical and Computer Engineering Publications; Journal of Applied Physics; 117, 17E508 (2015).

European Search Report, Application No. 17915593.2, dated Oct. 23, 2020.

Sun Zhe et. al., "Design of a new LWD NMR tool with high mechanical reliability" Journal of Magnetic Resonance, Academic Press, Orlando, FL, US,, vol. 317, Jul. 16, 2020.

\* cited by examiner

CONSTRUCTING NUCLEAR MAGNETIC RESONANCE (NMR) DEVICES BASED ON COST AND STRUCTURAL CONSTRAINTS

CROSS-REFERENCE TO RELATED APPLICATIONS

This application is a national stage entry of PCT/US2017/039700 filed Jun. 28, 2017, said application is expressly incorporated herein in its entirety.

TECHNICAL FIELD

The present technology generally pertains to drilling in earth formations, and more specifically, to nuclear magnetic resonance (NMR) tools employed to detect properties within earth formations adjacent a wellbore.

BACKGROUND

In the field of logging (e.g., wireline logging, logging while drilling (LWD) and measurement while drilling (MWD)), nuclear magnetic resonance (NMR) tools or sensors are often employed to explore subsurface formations based on the magnetic interactions with subsurface material. For example, NMR tools can determine properties of subsurface materials, including, among other things, a fractional volume of pore space, a fractional volume of mobile fluid filling the pore space and other petrophysical parameters. A NMR tool typically includes sensitive components such as magnets that generate a static magnetic field in adjacent subsurface materials as well as coils or antennas that induce a radio frequency (RF) magnetic field in the adjacent subsurface materials. Generally, induced RF magnetic fields are orthogonal to the static magnetic field in order to create appropriate conditions for NMR excitation/detection in the adjacent subsurface materials. For various logging applications, sensitive NMR components are housed within a drill collar for protection against various drilling forces in a wellbore drilling environment (e.g., stress, strain, torsion, impact, etc.). Although increasing the size of these sensitive components can increase NMR sensitivity and accuracy, their overall size is often limited by structural and cost constraints associated with materials used to construct the drill collar.

BRIEF DESCRIPTION OF THE DRAWINGS

The embodiments herein may be better understood by referring to the following description in conjunction with the accompanying drawings in which like reference numerals indicate analogous, identical, or functionally similar elements. Understanding that these drawings depict only exemplary embodiments of the disclosure and are not therefore to be considered to be limiting of its scope, the principles herein are described and explained with additional specificity and detail through the use of the accompanying drawings in which.

As illustrated, the same reference symbols in the various drawings indicate the same or substantially equivalent elements.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

As discussed above, drill collars house and protect sensitive logging tools from various forces in a wellbore environment. Often, with respect to NMR tools, larger components (e.g., magnet materials, coils, etc.) are desired because they can produce stronger magnetic fields, operate at higher frequencies, and increase signal-to-noise ratios, accuracy, resolution, and the like. However, the components are often constructed from materials too sensitive to provide mechanical support. Accordingly, a tradeoff exists between a volume occupied by the components and the structural integrity of the drill collar. Moreover, an outer diameter of the drill collar is typically fixed for a given wellbore application or wellbore environment. Because the outer diameter is fixed and because the components do not provide mechanical support for the drill collar, any increase in component dimensions (length, width, and/or height) reduces a corresponding amount of material used to construct the drill collar and reduces the structural integrity of the drill collar for a given cross-sectional area. In order to maximize the size of the components and also satisfy the structural constraints, expensive materials are often required in constructing drill collars. Accordingly, the NMR systems and devices disclosed herein include specific components selected, dimensioned, and arranged according to structural and cost constraints associated with materials used to construct the drill collar.

In this fashion, embodiments of the disclosure are directed to constructing cost-effective NMR downhole tools, which maximize sensitivity and accuracy for a specified interior volume of a drill collar and also account for structural and cost constraints for materials used to construct the drill collar. For example, according to one embodiment of this disclosure, a method for constructing an NMR downhole tool includes selecting a material to construct a drill collar based on a cost and a minimum diameter for a cross-sectional area of the material that satisfies a structural constraint, and determining an interior volume for the drill collar to house one or more drilling components based at least in part on the minimum diameter for the cross-sectional area of material. The method also includes disposing a central magnet and a booster magnet in the interior volume, where the central magnet substantially surrounds at least a portion of the booster magnetic element, and the booster magnetic element extends outward from each end of the central magnet to form a first axial side and a second axial side, opposite the first axial side. An antenna assembly is also positioned in the interior volume between the first axial side and the second axial side and about at least a portion of the central magnet. Further, a first end magnet is positioned in the interior volume proximate the first axial side of the booster magnetic element and a second end magnet is positioned in the interior volume proximate the second axial side of the booster magnetic element.

Figure 1:
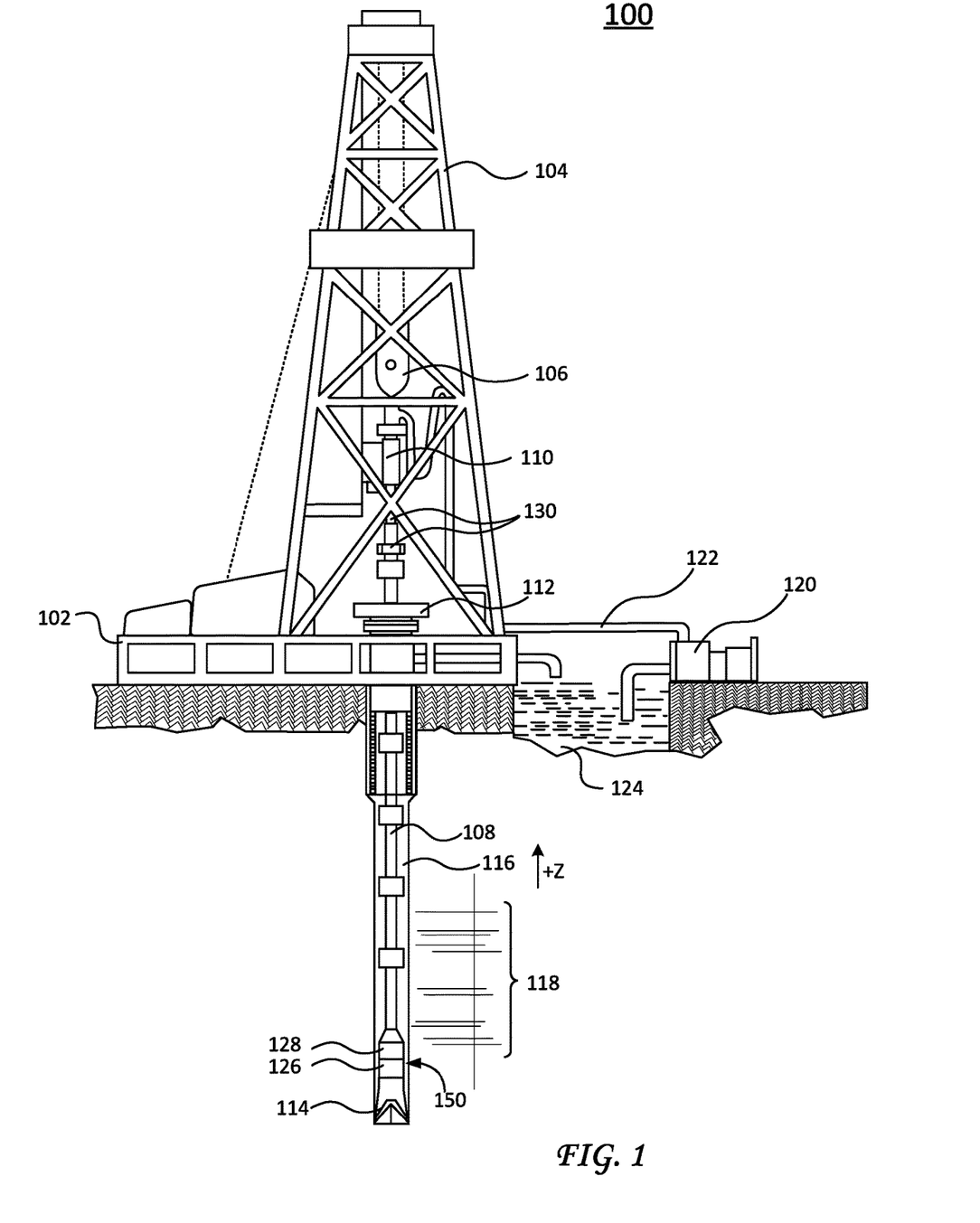
FIG. 1 is a schematic diagram of an example well system that includes an NMR tool in a drilling environment.

FIG. 1 is a schematic diagram of an exemplary well system 100 that may employ the various NMR systems, devices, and techniques disclosed herein. As illustrated, drilling system 100 particularly shows operations for a MWD) or LWD system. Drilling system 100 includes a drilling platform 102 having a derrick 104 and a hoist 106 to raise and lower a drill string 108. Hoist 106 suspends a top drive 110 suitable for rotating drill string 108 and lowering drill string 108 through a well head 112. Notably, drill string 108 may include sensors or other instrumentation for detecting and logging nearby characteristics and conditions of the wellbore and surrounding formation.

In operation, a top drive 110 supports and rotates drill string 108 as it is lowered through well head 112. In this fashion, drill string 108 (and/or a downhole motor) rotate a drill bit 114 coupled to a lower end of drill string 108 to create a wellbore 116 through various subsurface formations. A pump 120 circulates drilling fluid through a supply pipe 122 to top drive 110, down through an interior of drill string 108, through orifices in drill bit 114, back to the surface via an annulus around drill string 108, and into a retention pit 124. The drilling fluid transports cuttings from wellbore 116 into retention pit 124 and helps maintain wellbore integrity. Various materials can be used for drilling fluid, including oil-based fluids and water-based fluids.

Drilling system 100 also includes a bottom hole assembly (BHA) 150 coupled to drill string 108 near drill bit 114. BHA 150 includes one or more drill collars (e.g., thick-walled steel pipe) that provide weight and rigidity to convey a rotational force (e.g., torque) for drilling operations as well as various downhole measurement tools such as, but not limited to, MWD tools and LWD tools, which may be configured to gather detect and measure downhole drilling conditions. For example, the MWD and LWD tools may include a logging tool 126, which may comprise a nuclear magnetic resonance (NMR) logging tool or sensor as well as a telemetry sub 128. Notably, NMR tools may be employed during drilling operations, during wireline logging operations, or in other contexts, as appreciated by those skilled in the art.

Generally, the MWD and LWD tools and include various types of electronic sensors, transmitters, receivers, hardware, software, and/or additional interface circuitry for generating, transmitting, and detecting signals (e.g., sonic waves, etc.), storing information (e.g., log data), communicating with additional equipment (e.g., surface equipment, processors, memory, clocks, input/output circuitry, etc.), and the like. In particular, logging tools 126 can measure data such as position, orientation, weight-on-bit, strains, movements, borehole diameter, resistivity, drilling tool orientation, which may be specified in terms of a tool face angle (rotational orientation), an inclination angle (the slope), and compass direction, each of which can be derived from measurements by sensors (e.g., magnetometers, inclinometers, and/or accelerometers, though other sensor types such as gyroscopes, etc.). In addition, logging tools 126 can collect NMR measurements of the surrounding subterranean formations 118 as drill bit 114 extends wellbore 116 therethrough.

Figure 2:
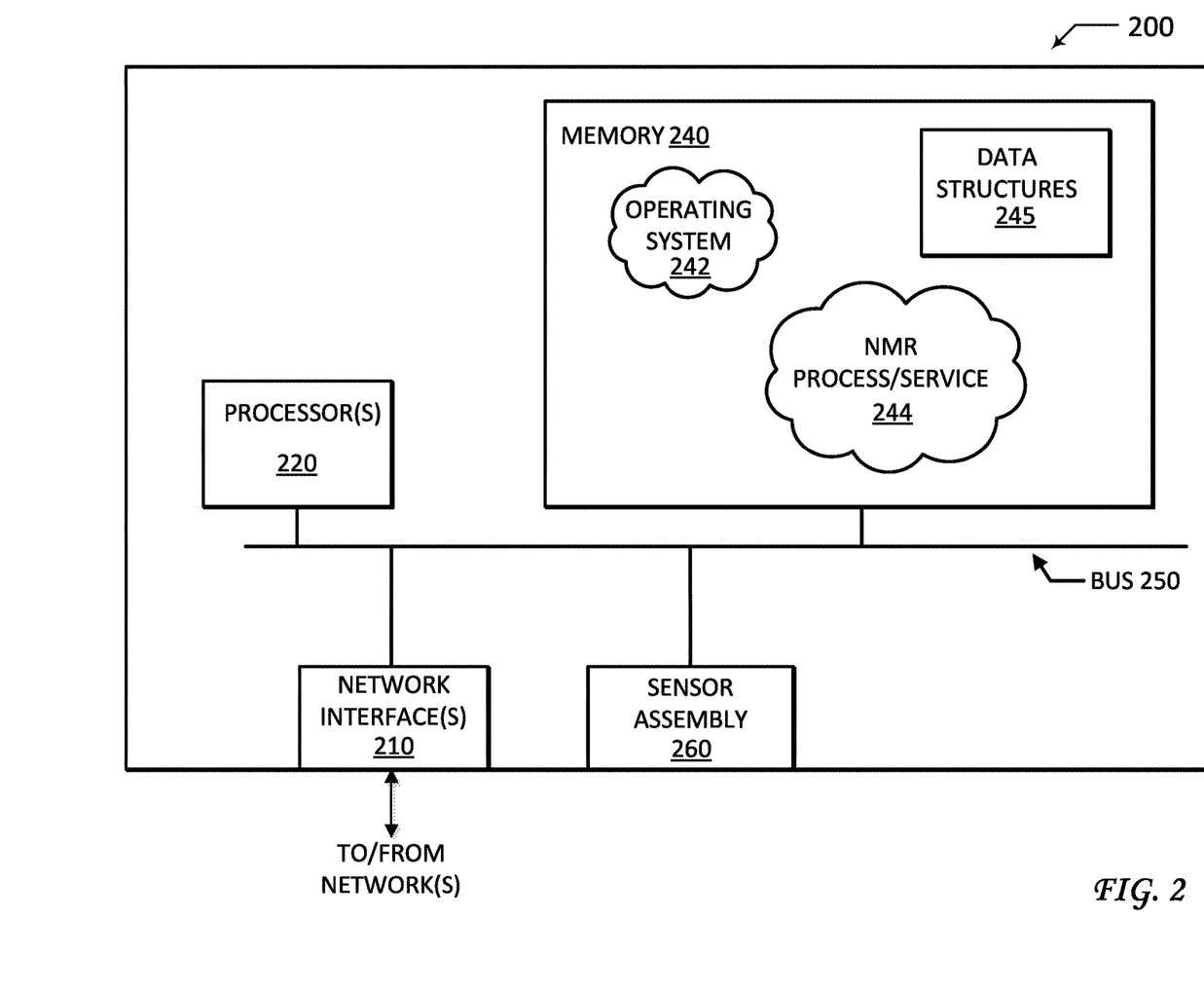
FIG. 2 is a block diagram of an example downhole tool for obtaining NMR data from wellbore environment.

Logging tool 126 and other sensors of the MWD and LWD tools are communicably coupled to a telemetry module 128, which transfers measurements and signals from the BHA to a surface receiver (not shown) and/or to receive commands from the surface receiver. Telemetry module 128 may encompass any known means of downhole communication including, but not limited to, a mud pulse telemetry system, an acoustic telemetry system, a wired communications system, a wireless communications system, or any combination thereof. In certain embodiments, some or all of the measurements taken at logging tool 126 may also be stored local (e.g., in local memory) of logging tool 126 or at telemetry module 128 for later retrieval at the surface upon retracting the drill string 108. At various times during the drilling process, drill string 108 may be removed from wellbore 116, as shown in FIG. 2.

It appreciated, the environments and systems shown in FIG. 1 are provided for purposes of discussion, not limitation, and further the various NMR tools and NMR techniques discussed herein may be suitable in any number of drilling environments, as is appreciated by those skilled in the art.

As discussed above, logging tools 126 can include nuclear magnetic resonance (NMR) hardware/software components. FIG. 2 is a block diagram of an example downhole tool 200 configured with NMR sensor components that are operable to perform NMR measurements and obtain NMR data from a wellbore environment.

As shown, downhole tool 200 includes hardware and software components such as network interfaces 210, at least one processor 220, sensor assembly 260 and a memory 240 interconnected by a system bus 250. Network interface(s) 210 include mechanical, electrical, and signaling circuitry for communicating data over communication links, which may include wireless or wired communication links (e.g., cable 204).

Processor 220 represents a digital signal processor (e.g., a microprocessor, a microcontroller, or a fixed-logic processor, etc.) configured to execute instructions or logic to perform tasks in a wellbore environment. Processor 220 may include a general purpose processor, special-purpose processor (where software instructions are incorporated into the processor), a state machine, application specific integrated circuit (ASIC), a programmable gate array (PGA) including a field PGA, an individual component, a distributed group of processors, and the like. Processor 220 typically operates in conjunction with shared or dedicated hardware, including but not limited to, hardware capable of executing software and hardware. For example, processor 220 may include elements or logic adapted to execute software programs and manipulate data structures 245, which may reside in memory 240.

Sensor assembly 260 includes various measurement components (e.g., magnetic elements, magnetic cores, etc.), which typically operate in conjunction with processor 220 to perform wellbore measurements such as NMR measurements, and can further include special-purpose processors, detectors, antenna, magnetic assemblies, radio frequency (RF) transmitters, receivers, and the like. In this fashion, sensors assembly 260 may include hardware/software for generating, transmitting, receiving, detection, logging, and/or sampling magnetic fields, seismic activity, and/or acoustic waves.

Memory 240 comprises a plurality of storage locations that are addressable by processor 220 for storing software programs and data structures 245 associated with the embodiments described herein. An operating system 242, portions of which are typically resident in memory 240 and executed by processor 220, functionally organizes the device by, inter alia, invoking operations in support of software processes and/or services executing on downhole tool 200. These software processes and/or services may comprise an illustrative "NMR" process/service 244, as described herein. Note that while process/service 244 is shown in centralized memory 240, some embodiments provide for these processes/services to be operated in a distributed computing network.

NMR process 244 generally operates to induce, using one or more magnetics, nuclei and/or other particles in volume of investigation and, during a relaxation period, the excited particles produce response signals (e.g., echo signals, etc.), which are detected by the antenna assembly. These response signals are further processed to determine various physical properties (e.g., porosity, density, viscosity, material content, etc.) of materials in the volume of interest.

It will be apparent to those skilled in the art that other processor and memory types, including various computer-readable media, may be used to store and execute program instructions pertaining to the borehole evaluation techniques described herein. Also, while the description illustrates various processes, it is expressly contemplated that various processes may be embodied as modules having portions of the curvature-based feedback control process 244 encoded thereon. In this fashion, the program modules may be encoded in one or more tangible computer readable storage media for execution, such as with fixed logic or programmable logic (e.g., software/computer instructions executed by a processor, and any processor may be a programmable processor, programmable digital logic such as field programmable gate arrays or an ASIC that comprises fixed digital logic. In general, any process logic may be embodied in processor 220 or computer readable medium encoded with instructions for execution by processor 220 that, when executed by the processor, are operable to cause the processor to perform the functions described herein.

Figure 3:
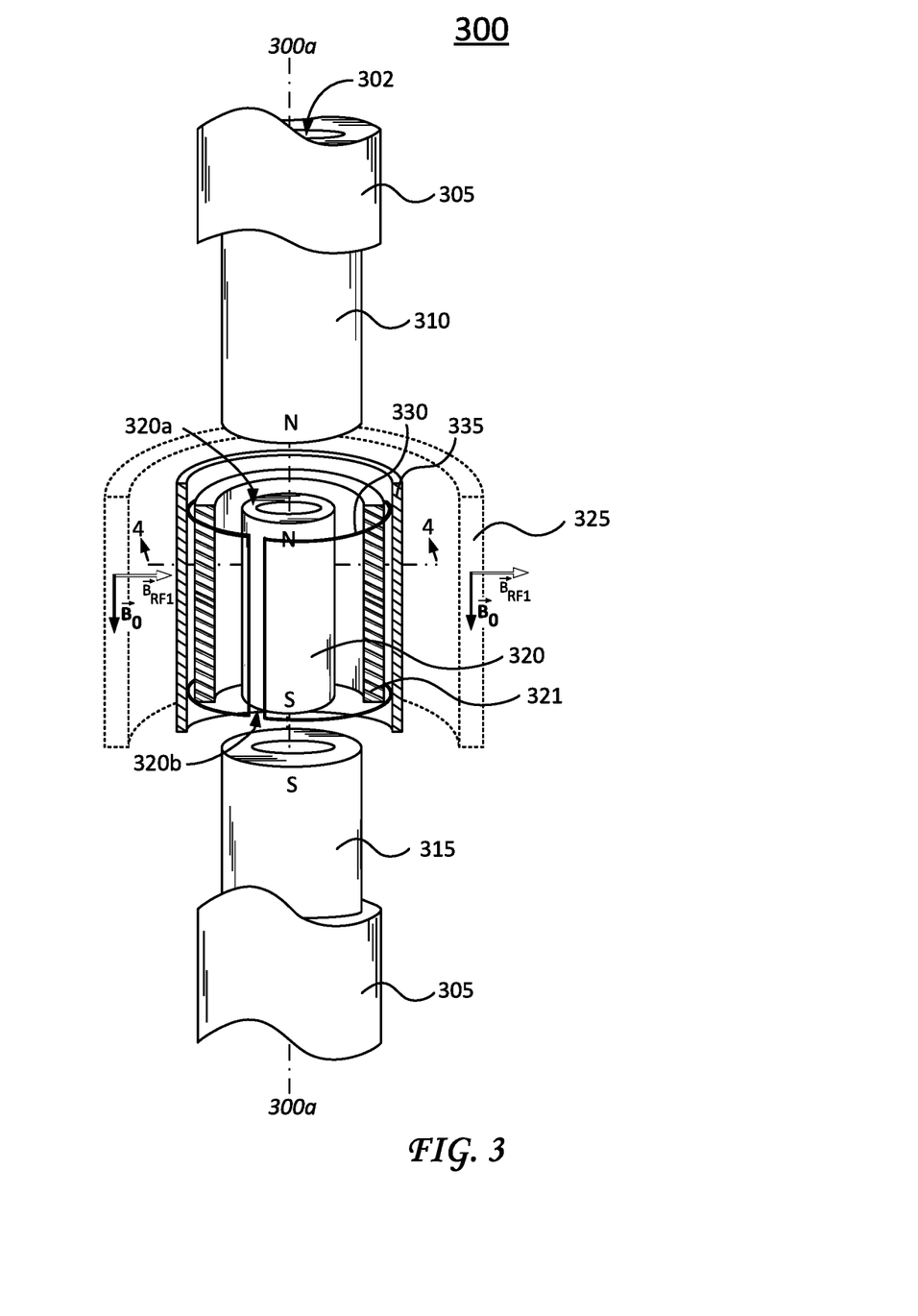
FIG. 3 is a perspective isometric view of a NMR sensor disposed in an interior volume of a drill collar.
Figure 4:
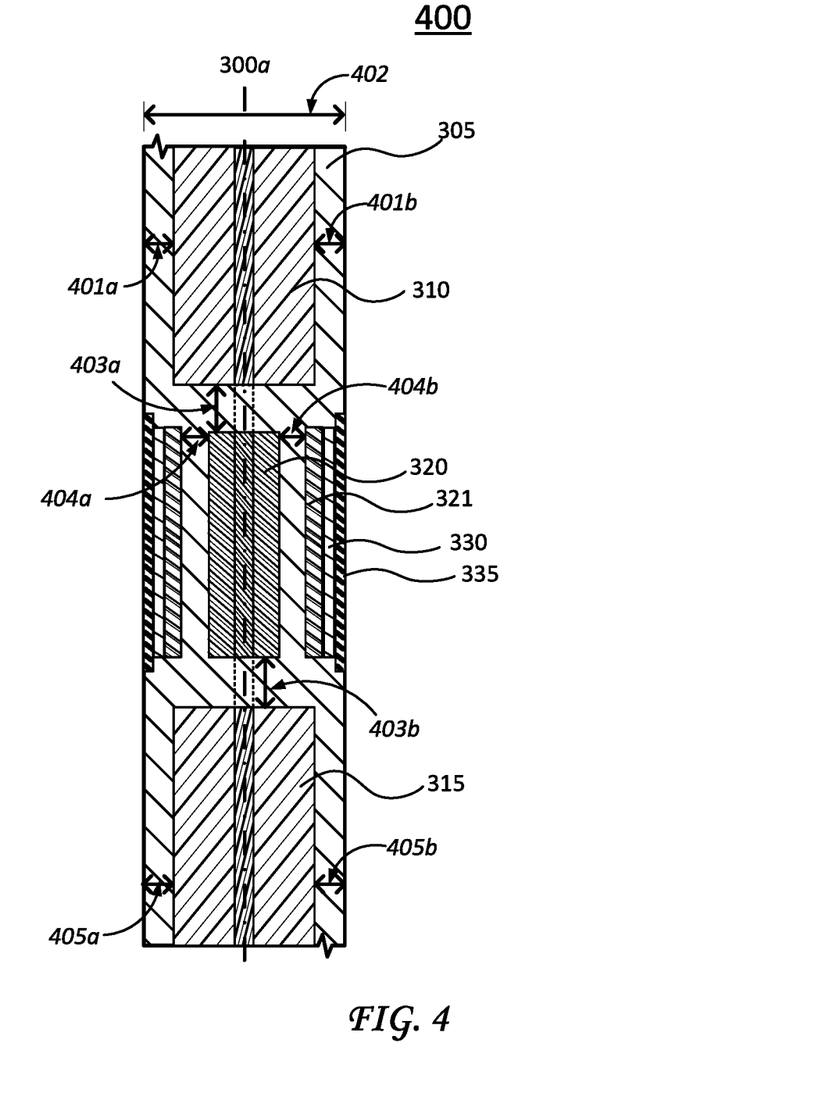
FIG. 4 is a cross-sectional view of the NMR sensor shown in FIG. 4, viewed along cut lines 4-4.

FIG. 3 is a perspective isometric view of an exemplary NMR sensor 300 disposed in an interior volume of a drill collar 305, and FIG. 4 illustrates a cross-sectional view of NMR sensor 300 taken along cut lines 4-4 shown in FIG. 3. Collectively, FIGS. 3 and 4 illustrate NMR components selected, dimensioned, and arranged according to structural and cost constraints associated with materials used to construct drill collar 305. As is appreciated by those skilled in the art, NMR sensor 300 can be used in well system 100, conveyance system 200, and other suitable wellbore system or environment.

As illustrated in FIG. 3, NMR sensor 300 is disposed in a drill collar 305. For purposes of clarity, a cutaway view of drill collar 305 is shown. Drill collar 305, as discussed above, provides rigidity to convey a rotational forces during drilling operations. In addition, drill collar 305 may be subjected to various impact forces as it rotates about axis 300a (e.g., drilling axis) as it conveys torque required to rotate drill bits/drill assemblies. Drill collar 305 generally has a cylindrical-shape and includes an interior conduit or channel 302 to direct drilling fluid or mud for lubricating drill bits/assemblies and carrying cuttings away from the drill bits/assemblies to the surface.

NMR sensor 300 is a cylindrical structure comprising a first magnet 310, a second magnetic 315, and a central magnet 320 disposed between first magnet 310 and second magnet 315. First magnet 310 and second magnet 315 cooperatively produce a static magnetic field $B_0$ having a desired strength, and central magnet 320 operates to shape the static magnetic field produced by first magnet 310 and second magnet 315. Notably, central magnet 320, first magnet 310 and/or second magnet 315 may each comprise one or more permanent magnetic pieces.

As illustrated, central magnet 320 is an elongated magnetic piece having a first axial end 320a and a second axial end 320b, opposite first axial end 320a. First magnet 310 and second magnet 315 are each axially offset a short distance from first axial end 320a, and second axial end 320b, respectively, as shown in FIG. 4 (measured at 403a and 403b). In addition, central magnet 320 is coupled to a soft magnetic core 321, which may form part of an antenna assembly (discussed below) extending about at least a portion of central magnet 320. Soft magnetic core 321 is typically selected from materials having a high saturation flux density to reduce its cross sectional area/volume when producing a desired magnetic field.

Still referring to FIG. 3, first and second magnets 310, 315 together with central magnet 320 define four magnetic poles, which may be arranged to shape or/and enhance the static magnetic field. In particular, during NMR operations, first magnet 310, second magnet 315, and central magnet 320 induce and shape a static magnetic field $B_0$ in a volume of investigation 325 (e.g., a desired volume of an adjacent earth formation in a wellbore environment). Notably, the static magnetic field $B_0$ is induced in a direction parallel to axis 300a, as indicated.

Volume of investigation 325 substantially and/or completely surrounds NMR sensor 300, however for purposes of clarity, a cutaway view of the volume of investigation 325 is shown. Volume of investigation 325 can be formed axially as well as radially to provide immunity or otherwise decrease its sensitivity to axial motion, lateral motion. Further, volume of investigation 325 is not restricted to any particular shape or size, and the shape and size thereof can be varied as required by an application or design.

NMR sensor 300 also includes an antenna assembly comprising an antenna 330 and soft magnetic core 321, which are typically disposed in a recess of drill collar 305. An antenna cover 335 protects the antenna assembly and may form an outward facing or exterior surface of drill collar 305. In this fashion, antenna cover may be subjected to the various forces of a wellbore environment as discussed herein. The antenna assembly extends at least partially about the circumference of a portion of central magnet 320. Here, antenna 330 is a transversal-dipole antenna and is coupled to soft magnetic core 321, which extends about an outer diameter of central magnet 320. The antenna assembly operatively generates a radio frequency (RF) magnetic field $B_{RF1}$ in a direction orthogonal to static magnetic field $B_0$. For example, antenna 330 can produce RF sequences (e.g., a series of pulses, delays, etc.) to excite nuclei in volume of investigation 325 and detect responsive signals (e.g., spin-echo signals or other NMR signals). These responsive signals are further processed to determine various physical properties of the adjacent formations. For sake of clarity, a cutaway view of antenna cover 335 and soft magnetic core 321 are shown so that internal components of NMR sensor 300 can be viewed. Further, although antenna 330 is illustrated as a single antenna, other embodiments discussed herein provide for two or more antenna (e.g., mutually orthogonal transversal-dipole antennas, etc.). In addition, although many of the components shown in FIG. 3 are depicted as generally cylindrical structures, the shape of these components are not limited to any particular shape, as is appreciated by those skilled in the art.

FIG. 4 illustrates a cross-sectional view that highlights the tradeoff between an interior volume of drill collar 305 that houses the NMR sensor components and a corresponding reduction to its cross-sectional area of structural material. Generally, drill collar 305 is a thick-walled tubular piece constructed from various materials such as steel, aluminum, alloys, and the like, while the NMR sensor components are constructed from materials too sensitive and too soft to provide structural support. In FIG. 4, the NMR sensor components are positioned relative to each other within the interior volume of drill collar 305, with certain distances or offsets (labeled as 401a, 401b, 402, 403a, 403b, 404a, 404b, 405a, and 405b) there-between. These distances define boundaries and dimensions of cross-sectional areas for drill collar materials, which provide structural or mechanical strength that supports drilling operations. The various drill collar materials are further associated with respective structural or mechanical strength constraints.

As shown, distance 402 represents a maximum diameter for an outside wall of drill collar 305. Certain smaller cross-sectional distances, such as distances 404a/404b, show a cross sectional area of drill collar material between an outer diameter of central magnet 320 and an interior diameter of soft magnetic core 321. Notably, distances 404a/404b measure a width for a lateral cross-sectional area of drill collar material disposed between central magnet 320 and soft magnetic core 321. Increasing the cross sectional area of central magnet 320 and/or soft magnetic core 321 typically increases the strength of respective magnetic fields but also decreases the cross sectional area of drill collar material disposed there-between (e.g., distances 404a/404b decrease). Similarly, increasing the size of first magnet 310 or second magnet 315 may cause a decrease in the cross-sectional distances 401a/401b, 403a/403b, and/or 405a/405b, which decreases the cross-sectional area of surrounding drill collar material. Often more expensive drill collar materials (e.g., with an appropriate strength for a smaller cross-sectional area) are required in order to satisfy structural constraints while also providing sufficient sensitivity/accuracy for NMR components.

Accordingly, this disclosure provides an improved NMR sensor having improved accuracy and sensitivity while also balancing the structural and cost constraints associated with materials of the drill collar. In particular, FIG. 5 and FIG. 6 illustrate one embodiment of an NMR sensor 500 constructed with such cost-effective approach.

Figure 5:
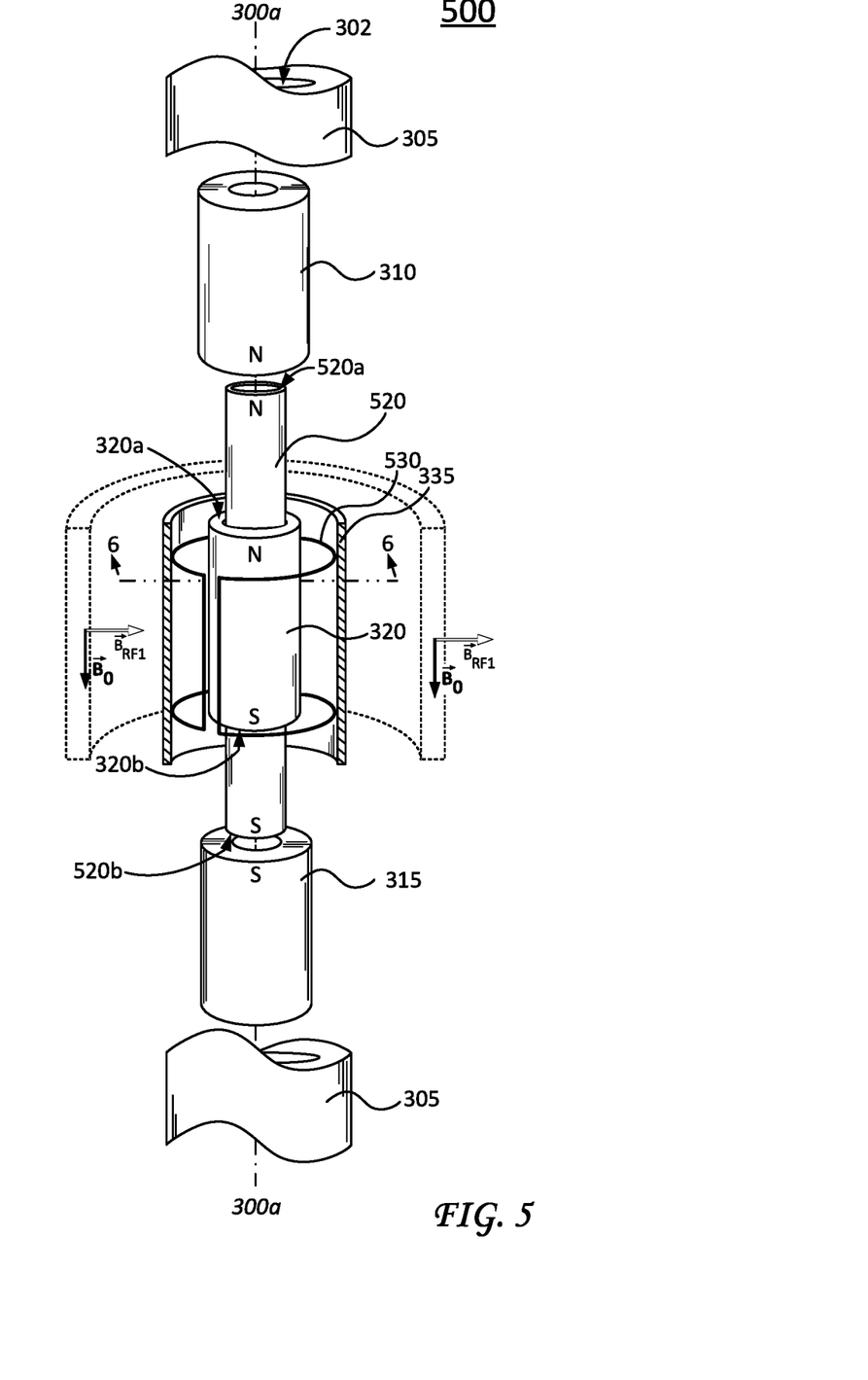
FIG. 5 is a perspective isometric view of another NMR sensor disposed in the interior volume of the drill collar.
Figure 6:
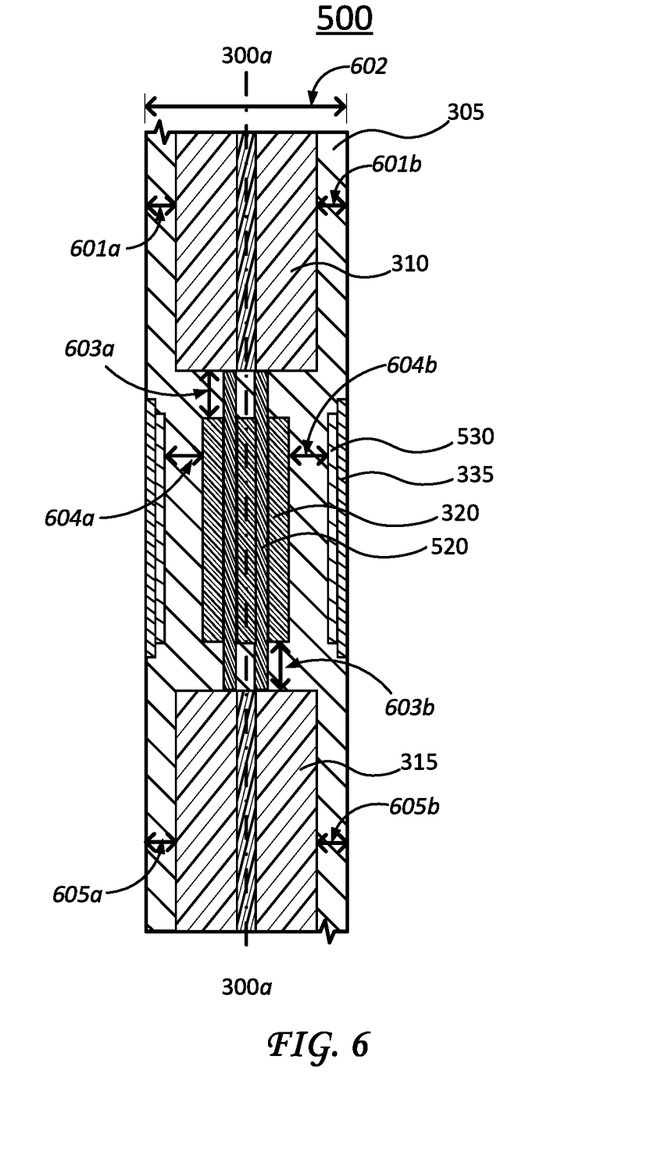
FIG. 6 is a cross-sectional view of the NMR sensor shown in FIG. 6, viewed along cut lines 6-6.

FIG. 5 is a perspective isometric view of NMR sensor 500 disposed in an interior volume of drill collar 305, and FIG. 6 illustrates a cross-sectional view of NMR sensor 500 taken along cut lines 5-5 shown in FIG. 5. Collectively, FIGS. 5 and 6 illustrates NMR components which are selected, dimensioned, and arranged according to structural and cost constraints associated with materials used to construct drill collar 305.

Referring to FIG. 5, NMR sensor 500 includes a magnet assembly that includes central magnet 320 (coupled to a booster magnetic element 520) and two end magnets—e.g., first magnet 310 and second magnet 320. Here, central magnet 320 substantially and/or completely surrounds booster magnetic element 520. Booster magnetic element 520 extends outward from each end of central magnet 320 to form a first axial side 520a and a second axial side 520b, opposite first axial side 520a. An antenna assembly 530, which may include one or more antennae and a soft magnetic core (not shown), is positioned in a recess of drill collar 305, and between first axial side 520a and second axial side 520b of the booster magnet element. Notably, the antenna assembly substantially surrounds the central magnet 320.

In addition, similar to FIGS. 3-4 (discussed above), NMR sensor 500 includes first magnet 310, which is positioned proximate first axial side 520a of booster magnetic element 520 to form one end of the NMR sensor, and second magnet 315 positioned proximate second axial side 520b of booster magnetic element 520 to form another end of NMR sensor.

FIG. 6 provides a cross-sectional view of NMR sensor 500, viewed along cut lines 6-6 of FIG. 5. Here, FIG. 6 illustrates a cross-sectional area of the magnetic assembly, which is increased or extended by booster magnetic element 520. Booster magnetic element 520 increases the strength of the magnetic field produced by the magnetic assembly (particularly first magnet 310 and second magnet 315), while also preserving the overall structural integrity of drill collar 305. Booster magnetic element 520 particularly extends a longitudinal cross-sectional area of the magnetic assembly (e.g., in the direction of axis 300a) without having significant impact on a lateral cross-sectional area of drill collar material, which lateral direction corresponds to the various stress forces experienced by drill collar 305. In this fashion, the dimensions for booster magnetic element 520, which extend beyond the ends of central magnet 320, do not significantly reduce the lateral cross-sectional area of the material of drill collar 305, thus preserving its structural integrity to resist forces in the lateral direction.

As discussed, booster magnetic element 520 operatively increases the strength of the magnetic field produced by the magnetic assembly (e.g., first magnet 310 and second magnet 315). For example, the static magnetic field $B_0$ produced by the magnetic assembly, shown in FIGS. 3-4, is represented by the following equation:

$$B_0 = B_{0(side)} + B_{0(shaping)} \qquad \text{Equation 1}$$

Where $B_{0side}$ is a magnetic field generated by first magnet 310 and second magnet 315, and $B_{0shaping}$ is a magnetic field generated by the central magnet—e.g., central magnet 320.

A static magnetic field $B'_0$ for the NMR sensor shown in FIGS. 5 and 6 is given by:

$$B'_0 = B_{0(side)} + B_{0(booster)} + B'_{0(shaping)} \qquad \text{Equation 2}$$

$$B'_0 = B_{0(side)}\left(1 + \frac{A_{(booster)}}{A_{(side)}}\right) + B'_{0(shaping)} \qquad \text{Equation 3}$$

Where $B_{0(booster)}$ is a magnetic field generated by booster magnetic element 520, $A_{(booster)}$ is a cross-sectional area of booster magnetic element 520, and $A_{(side)}$ is a cross-sectional area of each side magnet (e.g., first magnet 310 and second magnet 315).

If the cross-sectional area of the magnetic assembly is selected according to:

$$A'_{shaping} = A_{shaping}\left(1 + \frac{A_{(booster)}}{A_{(side)}}\right), \text{ then} \qquad \text{Equation 4}$$

$$(B'_0)_{(shaping)} = B_{0(shaping)}\left(1 + \frac{A_{(booster)}}{A_{(side)}}\right) \qquad \text{Equation 5}$$

The total static magnetic field can be represented by:

$$B'_0 = B_0\left(1 + \frac{A_{(booster)}}{A_{(side)}}\right) \qquad \text{Equation 6}$$

Thus, the static magnetic field retains its homogeneity and is boosted by a factor of $$\left(1 + \frac{A_{(booster)}}{A_{(side)}}\right).$$

Still referring to FIG. 6, the cross-sectional area the magnetic assembly (including its total diameter $OD_{shaping}$) maximizes the static magnetic field for a given axial homogeneity while also satisfying cost and structural constraints for a cross-sectional diameter of drill collar 305. For example, drill collar 305 may be subjected to torque (T) forces when operating in a wellbore environment. For a given torque constraint, a maximum sheer stress $T_{max}$ applied to the cross-sectional area of the drill collar that houses the NMR components can be approximated by a maximum shear stress of a uniform hallow circular section, as follows:

$$T_{max} = \frac{16}{\pi} * \frac{T * ID_{(antenna)}}{(ID_{(antenna)}^4 - OD_{(shaping)}^4)} \qquad \text{Equation 7}$$

Where $ID_{(antenna)}$ represents the inner diameter of the antenna assembly 530 (e.g., including a soft magnetic core (not shown)).

A maximum allowable shear or bending stress for a material used to construct drill collar 305 is determined by its shear strength for a given cross-sectional area. As discussed, the outer diameter of drill collar 305 is fixed. Accordingly, the maximum allowable stress for the material further limits the interior volume for housing NMR sensor components, thus limiting the outside diameter dimensions ($OD_{(shaping)}$) of the magnetic assembly as well as limiting the $ID_{(antenna)}$ dimensions. In this fashion, the maximum allowable stress defines, in part, a minimum wall thickness for the drill collar or a minimum cross-sectional area of material between the drill collar's outer diameter and its inner diameter.

Although torque (T) forces are illustrated above, various other forces, loads, stresses, and the like may similarly the interior volume and dimensions for NMR sensor components. The above equations can be adapted and applied to more granular cross-sectional requirements such as the cross-section corresponding to the central magnet as well as the cross-section corresponding to first magnet 310 and/or second magnet 315:

$$ID_{(antenna)}^2 - OD_{(shaping)}^2 \approx OD_{(collar)}^2 - OD_{(side)}^2 \qquad \text{Equation 8}$$

Where $OD_{(collar)}$ represents an outer diameter of the drill collar, and $OD_{(side)}$ represents an outer diameter of end magnets (e.g., first magnet 310 and/or second magnet 320).

Figure 7:
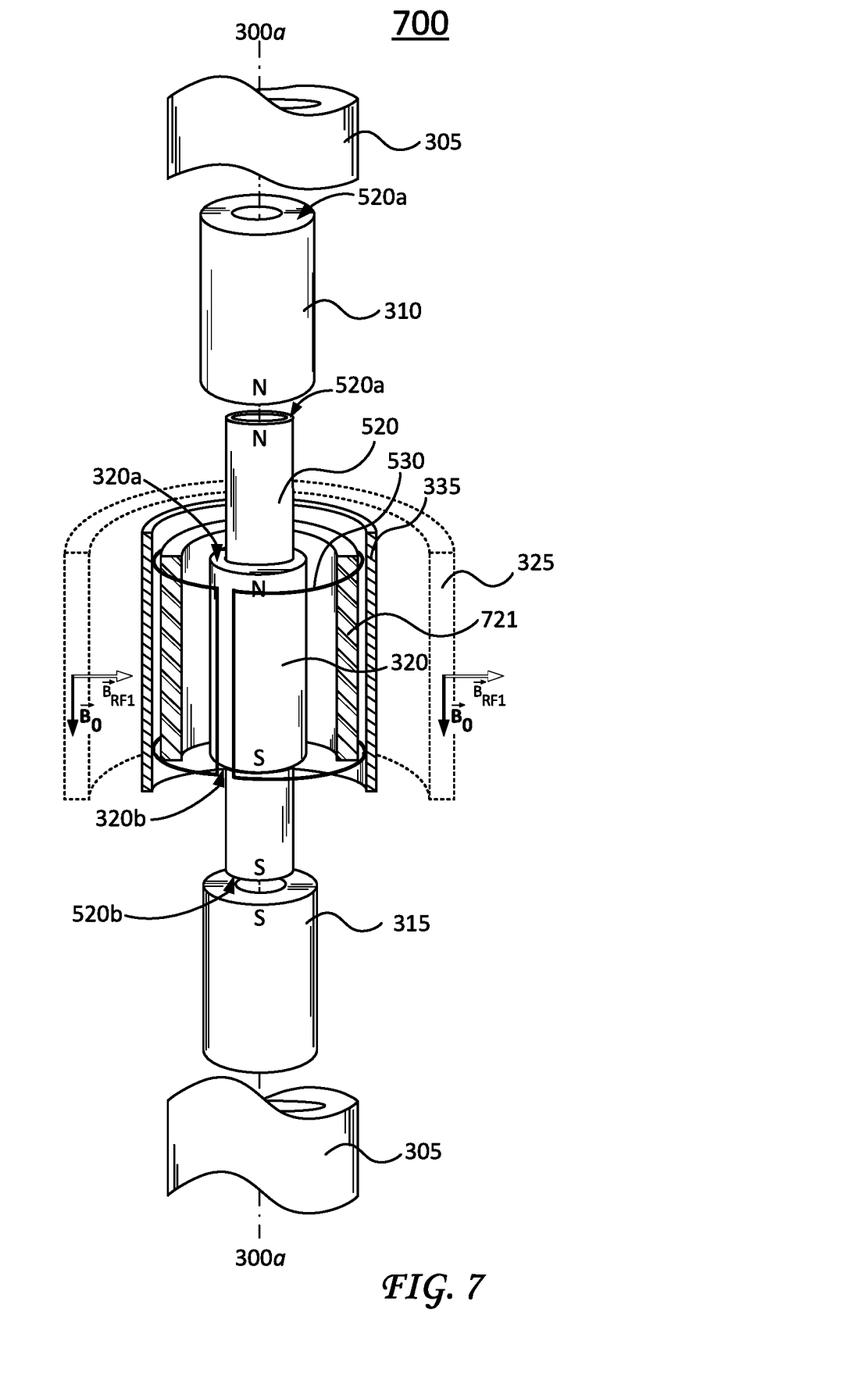
FIG. 7 is a cross-sectional view of an NMR sensor, showing a magnetic assembly having a soft magnetic core.

FIG. 7 is a perspective isometric view of a NMR sensor 700 in accordance with another embodiment of this disclosure. As illustrated, NMR sensor 700 includes a magnetic assembly comprising central magnet 320, booster magnetic element 520, and a soft magnetic core 721 (which may form part of antenna assembly 530). Here, soft magnetic core 721 is illustrated as a separate component for purposes of clarity and discussion. Soft magnetic core 721 extends about at least a portion of central magnet 320. For the purposes of illustrate and discussion herein, soft magnetic core 721 is shown in a cutaway view so that internal components of the magnetic assembly can be viewed. Similar to soft magnetic core 321 (discussed above), soft magnetic core 721 concentrates flux for an RF magnetic field generated by antenna assembly 530. Soft magnetic core 721 also electromagnetically shields NMR components from the RF magnetic field generated by antenna assembly 530. As a result, eddy current losses in the NMR sensor 300 are reduced by soft magnetic core 721. This reduction in eddy current may also reduce electromagnetic acoustic ringing, which may cause undesired signal interfering with the generated NMR signals.

Soft magnetic core 721 may also short magnetic flux from the static magnetic field depending on a magnetic permeability of its material. Generally, a greater magnetic permeability of material corresponds to a greater shorting capability of the magnetic flux. However, shorting of the magnetic flux reduces the static magnetic field in the volume of investigation 325 and also may saturate the soft magnetic core 721 and, therefore, reduce its efficiency. Accordingly, soft magnetic core 721 is generally constructed to have a lower effective magnetic permeability in the direction of the static magnetic field to reduce the shorting of the magnetic flux as well as other undesirable effects. Soft magnetic core 721 may be made of or otherwise include an anisotropic magnetic material having a magnetic permeability that varies with direction or may be made of or otherwise include isotropic magnetic material having a magnetic permeability that does not vary with direction.

Figure 8:
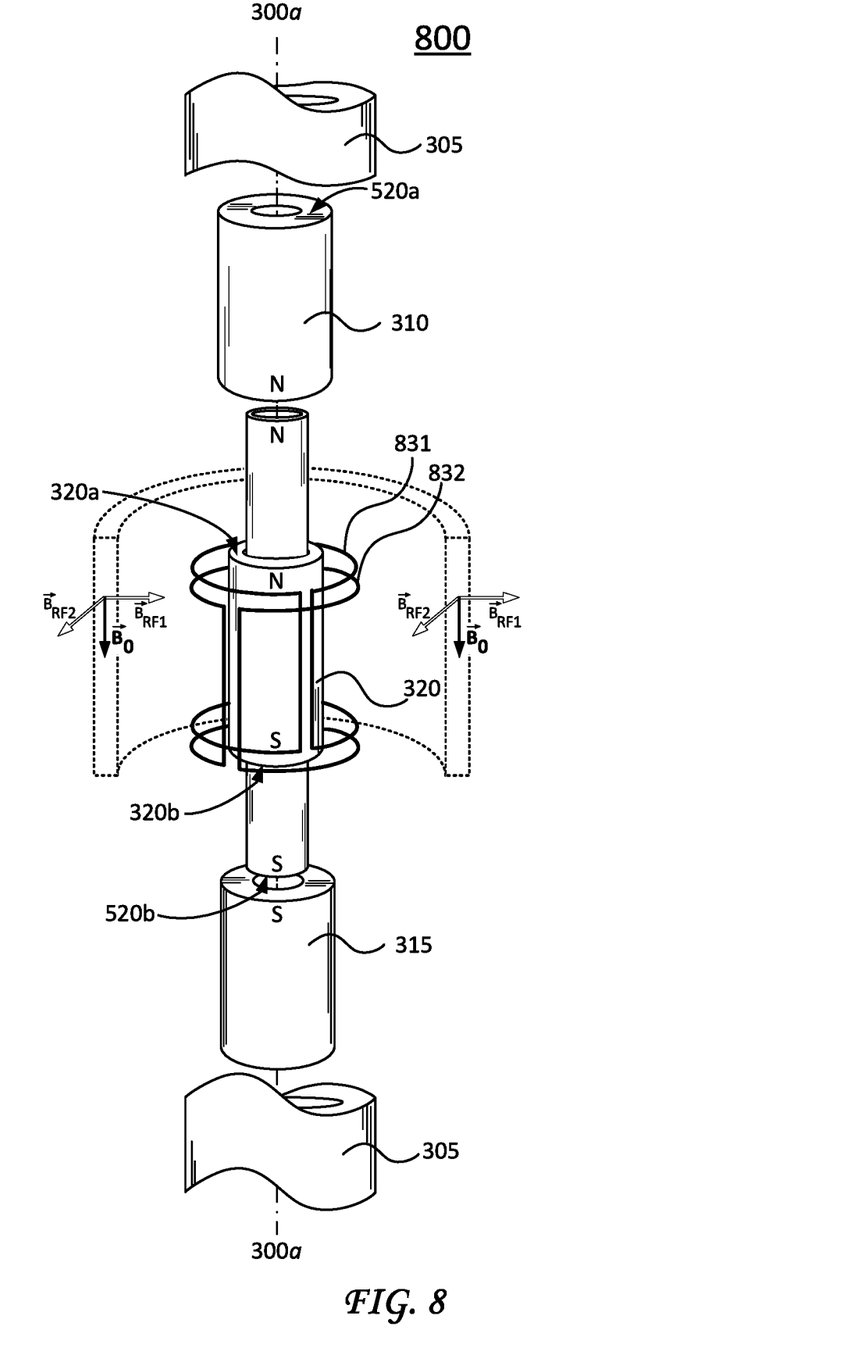
FIG. 8 is a cross-sectional view of an NMR sensor, showing an antenna assembly having mutually orthogonal transversal-dipole antennas.

FIG. 8 is a perspective isometric view of a NMR sensor 800 in accordance with various embodiments of this disclosure. As illustrated, NMR sensor 800 particularly includes an antenna assembly having two mutually orthogonal transversal-dipole antennas—here, antenna 831 and antenna 832. Antenna 831 and antenna 832 at least partially overlap each other and at least partially circumscribe the magnetic assembly (and in particular, central magnet 320). Antenna 831 and antenna 832 are mutually orthogonal and enable circular polarized excitation and quadrature coil detection (in the directions shown by $B_{RF1}$ and $B_{RF2}$) in order to increase signal-to-noise ratio and reduce overall power consumption. Notably, in some implementations, the antenna assembly may additionally or alternatively include an integrated coil set that performs the same operations of antenna 831 and antenna 832. For example, an integrated coil may be used (e.g., instead of the two transversal-dipole antennas) to produce circular polarization and perform quadrature coil detection. Examples of integrated coil sets that can be adapted to perform such operations include multi-coil or complex single-coil arrangements, such as, for example, birdcage coils commonly used for high-field magnetic resonance imaging (MRI).

Figure 9:
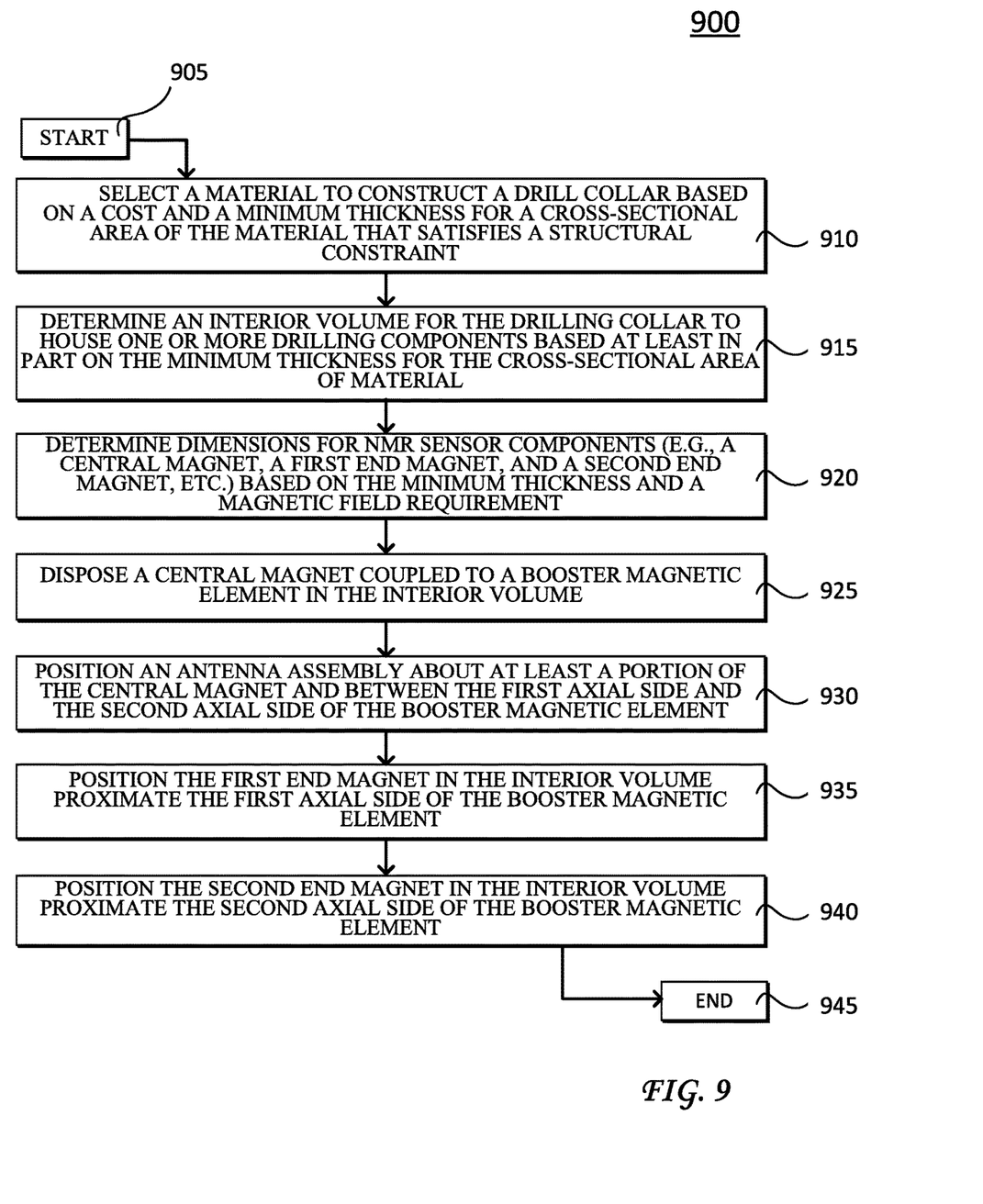
FIG. 9 is an exemplary simplified procedure for constructing a NMR sensor in accordance with embodiments of the present disclosure.

FIG. 9 is an exemplary simplified procedure 900 for constructing a NMR sensor according to one or more embodiments of this disclosure. Procedure 900 begins at step 905 and continues to step 910 where, as discussed above, a material is selected to construct a drill collar based on a cost and a minimum diameter for a cross-sectional are of the material that satisfies a structural constraint (e.g., withstanding various forces in a wellbore environment).

At step 915, procedure 900 determines an interior volume for the drilling collar to house one or more drilling components (e.g., NMR sensor components) based on the minimum diameter for the cross-sectional area of the material. Next, procedure 900 determines dimensions for the NMR sensor components based on a minimum thickness (e.g., a minimum wall thickness) for a cross-sectional area of drill collar material and also based on a magnetic field requirement (e.g., strength, axial homogeneity, radial gradients, etc.). As discussed in greater detail above, the NMR sensor components include a magnetic assembly having a central magnet coupled to a booster magnetic element as well as a first end magnet and a second end magnet. For each NMR sensor component, individual dimensions (e.g., respective diameter dimensions, etc.) are determined based on the minimum thickness of drill collar material for a corresponding lateral cross-sectional area of the drill collar material. For example, the diameter of the first magnet is determined based, in part, on the minimum thickness for the cross-sectional area of material surrounding the first magnet, and so on.

Next, at step 925, the central magnet coupled to the booster magnetic element is disposed in the interior volume of the drill collar. As discussed above, the central magnet is coupled to and substantially surrounds the booster magnetic element. Further, the booster magnetic element extends outward from each end of the central magnetic element to form a first axial side and a second axial side, opposite the first axial side. The booster magnetic element operates to increase the magnetic field produced by the NMR sensor (e.g., first end magnet and second end magnet) by increasing a functional magnetic cross-sectional area which allows the NMR sensor to operate at a higher frequency, increases signal-to-noise ratios, improves accuracy, and the like. The booster magnetic element particularly increases a longitudinal direction of a magnetic cross-sectional area, while only minimally increasing a lateral direction of a magnetic cross-sectional area. In this fashion, the booster magnetic element does not compromise the integrity of drill collar as the drill collar is subjected to various forces during wellbore operations.

At step 930, an antenna assembly is positioned about at least a portion of the central magnet and between the first axial side and the second axial side of the booster magnetic element. For example, as discussed above, the antenna assembly may be disposed in a recess of the drill collar. Notably, the antenna assembly can include one or more antennae (e.g., monopole antenna, dipole antenna, mutually orthogonal transversal-dipole antennae, etc.) as well as a soft magnetic core, as is appreciated in the art.

At steps 935 and 940, the first end magnet is positioned in the interior volume proximate the first axial side of the booster magnetic element and the second end magnet is positioned in the interior volume proximate the second axial side of the booster magnetic element, respectively.

Procedure 900 subsequently ends at step 945, but may continue on to begin again at step 905. It should be noted that certain steps within procedure 900 may be optional, and further, the steps shown in FIG. 9 are merely examples for illustration—certain other steps may be included or excluded as desired. Further, while a particular order of the steps is shown, this ordering is merely illustrative, and any suitable arrangement of the steps may be utilized without departing from the scope of the embodiments herein.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub combination. A number of examples have been described. Nevertheless, it will be understood that various modifications can be made. Accordingly, other implementations are within the scope of the following claims.

While there have been shown and described illustrative embodiments for curvature-based feedback controls that provide simultaneous convergence for positions and attitudes between an actual wellbore path and a planned well path, it is to be understood that various other adaptations and modifications may be made within the spirit and scope of the embodiments herein. For example, the embodiments have been shown and described herein with respect to specific configurations of cylindrical magnetic elements. However, the embodiments in their broader sense are not as limited, and may, in fact, be used with any configuration of magnetic elements. In addition, it is appreciated that various other components that support NMR operations may be readily included without departing from the sprit and scope of this disclosure. Accordingly this description is to be taken only by way of example and not to otherwise limit the scope of the embodiments herein. Therefore, it is the object of the appended claims to cover all such variations and modifications as come within the true spirit and scope of the embodiments herein.

STATEMENTS OF THE DISCLOSURE INCLUDE

Statement 1: A method comprising: selecting a material to construct a drill collar based on a cost and a minimum thickness for a cross sectional area of the material that satisfies a structural constraint; determining an interior volume for the drill collar to house one or more drilling components based at least in part on the minimum thickness for the cross-sectional area of the material; disposing a central magnet coupled to a booster magnet element in the interior volume, the central magnet substantially surrounds at least a portion of a booster magnetic element, and the booster magnetic element extends outward from a first end of the central magnetic element to form a first axial side and from a second end of the central magnet to form a second axial side, opposite the first axial side; positioning an antenna assembly proximate to the interior volume between the first axial side and the second axial side and about at least a portion of the central magnet; positioning a first end magnet in the interior volume proximate the first axial side of the booster magnetic element; and positioning a second end magnet in the interior volume proximate the second axial side of the booster magnetic element.

Statement 2: The method of Statement 1, further comprising: determining the minimum thickness for the cross-sectional area of the material disposed between the central magnet and the antenna assembly.

Statement 3: The method of Statement 1 or 2, further comprising: determining an outer diameter for a portion of the central magnet based on the minimum thickness for the cross-sectional area of the material disposed between the central magnet and the antenna assembly.

Statement 4: The method of Statement 1, further comprising: determining a first outer diameter for the first end magnet based on the minimum thickness for the cross-sectional area of the material disposed between the first end magnet and the central magnet; determining a second outer diameter for the second end magnet based on the minimum thickness for the cross-sectional area of the material disposed between the second end magnet and the central magnet; and determining a third outer diameter for the central magnet based on the minimum thickness for the cross-sectional area of the material disposed between the central magnet and the antenna assembly.

Statement 5: The method of Statement 4, wherein the third outer diameter is smaller than the first outer diameter and smaller than the second outer diameter.

Statement 6: The method of Statement 1, wherein the first end magnet has a first diameter, the second end magnet has a second diameter, and the central magnet has a third diameter, and wherein the third diameter is smaller than the first diameter and smaller than the second diameter.

Statement 7: The method of Statement 1, wherein the central magnet shapes a static magnetic field generated, in part, by the first end magnet, the second end magnet, and the booster magnetic element, the method further comprising: determining dimensions for each of the central magnet to shape the static magnetic field based on at least one of an axial homogeneity constraint or a radial gradient constraint.

Statement 8: The method of one or more of Statements 1 through 7, wherein the antenna assembly includes at least one coil.

Statement 9: The method of Statement 8, wherein the at least one coil forms a transversal-dipole antenna, the method further comprising: forming a transversal-dipole antenna using the at least one coil of the antenna assembly; coupling an antenna cover to the transversal-dipole antenna; and coupling the antenna cover to an interior wall of the drill collar.

Statement 10: The method of one or more of Statements 1 through 7, wherein the antenna assembly includes at least two transversal-dipole antennae, the method further comprising: orienting a first transversal-dipole antenna orthogonal to a second transversal-dipole antenna.

Statement 11: The method of one or more of Statements 1 through 7, wherein the antenna assembly includes a soft magnetic core that substantially surrounds at least a portion of the central magnet.

Statement 12: The method of one or more of Statements 1 through 7, further comprising: determining the structural constraint based on a shear stress tolerance for the minimum thickness of the cross-sectional area of the material.

Statement 13: The method of one or more of Statements 1 through 7, wherein the antenna assembly comprises at least two mutually orthogonal transversal-dipole antennas.

Statement 14: A system operable in a wellbore environment, comprising: a drill collar having an interior volume that defines a conduit about a drilling axis and houses one or more drilling components, the interior volume is determined by a cost of material associated with a minimum thickness for a cross-sectional area that satisfies a structural constraint; a central magnet coupled to a booster magnetic element disposed in the interior volume, the central magnet includes substantially surrounds at least a portion of a booster magnetic element, the booster magnetic element extends outward from a first end of the central magnetic element to form a first axial side and from a second end of the central magnetic element to form a second axial side, opposite the first axial side; an antenna assembly positioned proximate the interior volume between the first axial side and the second axial side and about at least a portion of the central magnet; a first end magnet positioned in the interior volume proximate the first axial side; and a second end magnet positioned in the interior volume proximate the second axial side.

Statement 15: The well system of Statement 14, wherein the first end magnet has a first outer diameter, the second end magnet has a second outer diameter, and the central magnet has a third outer diameter, wherein the third outer diameter is smaller than the first outer diameter and smaller than the second outer diameter.

Statement 16: The well system of one or more of Statements 14 through 15, wherein the antenna assembly comprises a transversal-dipole antenna to generate a radio frequency (RF) magnetic field in a direction orthogonal to a static magnetic field, the static magnetic field induced, in part, by the first end magnet and the second end magnet.

Statement 17: The well system of one or more of Statements 14 through 16, wherein a portion of the drill collar defines a recess, wherein the antenna assembly includes at least one coil and an antenna cover, and wherein the antenna assembly is disposed in the recess.

Statement 18: A nuclear magnetic resonance (NMR) sensor, comprising: a central magnet coupled to a booster magnetic element housed by an interior volume of a drill collar, the interior volume determined by a cost of material associated with a minimum thickness for a cross-sectional area that satisfies a structural constraint, the central magnet substantially surrounds at least a portion of a booster magnetic element, the booster magnetic element extends outward from a first end of the central magnetic element to form a first axial side and from a second end of the central magnetic element to form a second axial side, opposite the first axial side; an antenna assembly positioned proximate to the interior volume between the first axial side and the second axial side and about at least a portion of the central magnet; a first end magnet positioned in the interior volume proximate the first axial side; and a second end magnet positioned in the interior volume proximate the second axial side.

Statement 19: The NMR sensor of Statement 18, wherein a portion of the drill collar defines a recess, and wherein the antenna assembly is disposed in the recess.

Statement 20: The NMR sensor of one or more of Statements 18 through 19, wherein the first end magnet and the second end magnet are permanent magnets, and wherein the antenna assembly includes a soft magnetic core.

What is claimed is:
1. A method comprising:
selecting a material to construct a drill collar based on a cost and a minimum thickness for a cross sectional area of the material that satisfies a structural constraint;
determining an interior volume for the drill collar to house one or more drilling components based at least in part on the minimum thickness for the cross-sectional area of the material;
disposing a central magnet and a booster magnetic element in the interior volume, the central magnet substantially surrounds at least a portion of a booster magnetic element, the booster magnetic element extends outward from a first end of the central magnetic element to form a first axial side and from a second end of the central magnet to form a second axial side, opposite the first axial side;

positioning an antenna assembly proximate to the interior volume between the first axial side and the second axial side and about at least a portion of the central magnet;

positioning a first end magnet in the interior volume proximate the first axial side of the booster magnetic element; and positioning a second end magnet in the interior volume proximate the second axial side of the booster magnetic element.

2. The method of claim 1, further comprising:
determining the minimum thickness for the cross-sectional area of the material disposed between the central magnet and the antenna assembly.

3. The method of claim 1, further comprising:
determining an outer diameter for a portion of the central magnet based on the minimum thickness for the cross-sectional area of the material disposed between the central magnet and the antenna assembly.

4. The method of claim 1, further comprising:
determining a first outer diameter for the first end magnet based on the minimum thickness for the cross-sectional area of the material disposed between the first end magnet and the central magnet;
determining a second outer diameter for the second end magnet based on the minimum thickness for the cross-sectional area of the material disposed between the second end magnet and the central magnet; and
determining a third outer diameter for the central magnet based on the minimum thickness for the cross-sectional area of the material disposed between the central magnet and the antenna assembly.

5. The method of claim 4, wherein the third outer diameter is smaller than the first outer diameter and smaller than the second outer diameter.

6. The method of claim 1, wherein the first end magnet has a first diameter, the second end magnet has a second diameter, and the central magnet has a third diameter, and wherein the third diameter is smaller than the first diameter and smaller than the second diameter.

7. The method of claim 1, wherein the central magnet shapes a static magnetic field generated, in part, by the first end magnet, the second end magnet, and the booster magnet, the method further comprising:
determining dimensions for the central magnet to shape the static magnetic field based on at least one of an axial homogeneity constraint or a radial gradient constraint.

8. The method of claim 1, wherein the antenna assembly includes at least one coil.

9. The method of claim 8, wherein the at least one coil forms a transversal-dipole antenna, the method further comprising:
forming a transversal-dipole antenna using the at least one coil of the antenna assembly;
coupling an antenna cover to the transversal-dipole antenna; and
coupling the antenna cover to an interior wall of the drill collar.

10. The method of claim 1, wherein the antenna assembly includes at least two transversal-dipole antenna, the method further comprising:
orienting a first transversal-dipole antenna orthogonal to a second transversal-dipole antenna.

11. The method of claim 1, wherein the antenna assembly further includes an antenna and a soft magnetic core that substantially surrounds at least a portion of the central magnet.

12. The method of claim 1, further comprising:
determining the structural constraint based on a shear stress tolerance for the minimum thickness of the cross-sectional area of the material.

13. The method of claim 1, wherein the antenna assembly comprises at least two mutually orthogonal transversal-dipole antennas.

14. A system operable in a well environment, comprising:
a drill collar having an interior volume that defines a conduit about a drilling axis and houses one or more drilling components, the interior volume is determined by a cost of material associated with a minimum thickness for a cross-sectional area that satisfies a structural constraint;
a central magnet coupled to a booster magnetic element disposed in the interior volume, the central magnet substantially surrounds at least a portion of a booster magnetic element, the booster magnetic element extends outward from a first end of the central magnetic element to form a first axial side and from a second end of the central magnetic element to form a second axial side, opposite the first axial side;
an antenna assembly positioned proximate the interior volume between the first axial side and the second axial side and about at least a portion of the central magnet;
a first end magnet positioned in the interior volume proximate the first axial side; and
a second end magnet positioned in the interior volume proximate the second axial side.

15. The system of claim 14, wherein the first end magnet has a first outer diameter, the second end magnet has a second outer diameter, and the central magnet has a third outer diameter, wherein the third outer diameter is smaller than the first outer diameter and smaller than the second outer diameter.

16. The system of claim 14, wherein the antenna assembly comprises a transversal-dipole antenna to generate a radio frequency (RF) magnetic field in a direction orthogonal to a static magnetic field, the static magnetic field induced, in part, by the first end magnet and the second end magnet.

17. The system of claim 16, wherein a portion of the drill collar defines a recess, wherein the antenna assembly includes at least one coil and an antenna cover, and wherein the antenna assembly is disposed in the recess.

18. A nuclear magnetic resonance (NMR) sensor, comprising:
a central magnet coupled to a booster magnetic element housed by an interior volume of a drill collar, the interior volume determined by a cost of material associated with a minimum thickness for a cross-sectional area that satisfies a structural constraint, the central magnet substantially surrounds at least a portion of a booster magnetic element, the booster magnetic element extends outward from a first end of the central magnetic element to form a first axial side and from a second end of the central magnetic element to form a second axial side, opposite the first axial side;
an antenna assembly positioned proximate to the interior volume between the first axial side and the second axial side and about at least a portion of the central magnet;
a first end magnet positioned in the interior volume proximate the first axial side; and a second end magnet positioned in the interior volume proximate the second axial side.

19. The NMR sensor of claim 18, wherein a portion of the drill collar defines a recess, and wherein the antenna assembly is disposed in the recess.

20. The NMR sensor of claim 18, wherein the first end magnet and the second end magnet are permanent magnets, and wherein the antenna assembly includes a soft magnetic core.

* * * * *